United States Patent
Ku et al.

(10) Patent No.: US 9,606,294 B2
(45) Date of Patent: Mar. 28, 2017

(54) OPTICAL COMPONENT

(71) Applicant: Industrial Technology Research Institute, Hsinchu (TW)

(72) Inventors: Kai-Ning Ku, Hsinchu County (TW); Chih-Lin Wang, Hsinchu (TW); Shang-Chun Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/222,956

(22) Filed: Jul. 29, 2016

(65) Prior Publication Data

US 2017/0031102 A1 Feb. 2, 2017

Related U.S. Application Data

(60) Provisional application No. 62/198,645, filed on Jul. 29, 2015.

(51) Int. Cl.
G02B 6/30 (2006.01)
G02B 6/12 (2006.01)
(Continued)

(52) U.S. Cl.
CPC ......... G02B 6/305 (2013.01); G02B 6/12004 (2013.01); H01S 5/0425 (2013.01);
(Continued)

(58) Field of Classification Search
CPC ............... G02B 6/305; G02B 6/12004; G02B 2006/12147; G02B 2006/12121; H01S 5/0425; H01S 5/12
See application file for complete search history.

(56) References Cited

U.S. PATENT DOCUMENTS

| | | | |
|---|---|---|---|
| 6,778,718 B2 * | 8/2004 | Maxwell | G02B 6/423 385/14 |
| 6,799,713 B2 * | 10/2004 | Lee | G02B 6/423 228/165 |

(Continued)

FOREIGN PATENT DOCUMENTS

| | | |
|---|---|---|
| CN | 102142656 | 8/2011 |
| TW | I418869 | 12/2013 |

OTHER PUBLICATIONS

Tung et al., "Sub-Micron-Accuracy Gold-to-Gold Interconnection Flip-Chip Bonding Approach for Electronics—Optics Heterogeneous Integration," Japanese Journal of Applied Physics, Apr. 2013, pp. 04CB08.

*Primary Examiner* — Ryan Lepisto
(74) *Attorney, Agent, or Firm* — Jianq Chyun IP Office

(57) ABSTRACT

An optical component optically coupled to an optical fiber includes a substrate and an edge-emitting laser. The substrate includes an accommodating cavity, a plurality of openings, a waveguide, an optical coupler and a plurality of pads. The waveguide and the optical coupler are distributed outside the accommodating cavity. The openings are distributed at the bottom surface of the accommodating cavity and the pads are located at the bottom of the openings. The optical coupler is optically coupled to an end of the waveguide and includes a light-incident surface. The edge-emitting laser is embedded in the accommodating cavity and includes a light-emitting layer and a plurality of bumps located in the openings and electrically connected to the pads. The ratio of the level height difference between the light-emitting layer and the optical coupler to the thickness of the optical coupler ranges from 0 to 0.5.

13 Claims, 5 Drawing Sheets

(51) Int. Cl.
*H01S 5/042* (2006.01)
*H01S 5/12* (2006.01)

(52) U.S. Cl.
CPC ...... *H01S 5/12* (2013.01); *G02B 2006/12121* (2013.01); *G02B 2006/12147* (2013.01)

(56) References Cited

U.S. PATENT DOCUMENTS

| | | | | |
|---|---|---|---|---|
| 6,804,444 | B2* | 10/2004 | Shin | G02B 6/12004 385/131 |
| 6,839,497 | B2* | 1/2005 | Park | G02B 6/12004 385/129 |
| 7,361,520 | B2* | 4/2008 | Watanabe | G02B 6/12004 216/24 |
| 7,663,210 | B2* | 2/2010 | Karkkainen | G02B 6/423 257/226 |
| 8,036,507 | B2* | 10/2011 | Watanabe | G02B 6/12004 385/49 |
| 8,594,477 | B2* | 11/2013 | Watanabe | G02B 6/423 257/98 |
| 8,805,129 | B2* | 8/2014 | Han | G02B 6/423 385/129 |
| 8,831,049 | B2 | 9/2014 | Feng et al. | |
| 9,323,011 | B1* | 4/2016 | Feng | G02B 6/125 |
| 9,470,855 | B1* | 10/2016 | Shubin | G02B 6/4228 |
| 2004/0114869 | A1 | 6/2004 | Fike et al. | |
| 2008/0056638 | A1* | 3/2008 | Glebov | G02B 6/423 385/9 |
| 2013/0209033 | A1* | 8/2013 | Luff | G02B 6/1228 385/28 |
| 2014/0023313 | A1* | 1/2014 | Kim | G02B 6/12 385/14 |

* cited by examiner

OPTICAL COMPONENT

CROSS-REFERENCE TO RELATED APPLICATION

This application claims the priority benefits of U.S. provisional application Ser. No. 62/198,645, filed on Jul. 29, 2015. The entirety of the above-mentioned patent application is hereby incorporated by reference herein and made a part of this specification.

BACKGROUND OF THE DISCLOSURE

Technical Field

The present disclosure generally relates to a semiconductor component, in particular, to an optical component.

Description of Related Art

With the rapid development of the Internet, a variety of multimedia applications on the Internet derived from the bandwidth requirements are also increasing. Therefore, the optical fiber communication technology used in long-distance communications in the past has gradually been used in short-distance communications. In other words, applications of the optical fiber communication have been used in end use, to meet the users' needs. In the field of optical communications, the development and the manufacture of the optical transceiver play a crucial role. The typical optical transceiver uses laser diodes as a light source, and those used laser diodes can be partitioned into many types of laser diodes, for example, the Fabry-Perot laser diode used in short-distance or low-speed transmission, or the distributed feedback laser diode (DFB laser diode) used in long-distance or high-speed transmission, and so on.

In the typical optical transceiver, the material of the optical transceiver chip is different from that of the laser diode. Therefore, the manufacturing process of the laser diode cannot be integrated into that of the optical transceiver chip. Usually, the laser diode requires a separate manufacturing process, and then the manufactured laser diode is bonded with the optical transceiver chip. In the process for bonding the laser diode with the optical transceiver chip, if there is an error occurring in the alignment between the laser diode and the waveguide, it will affect the optical coupling efficiency between the laser diode and the waveguide, and affect the performance and the reliability of the optical transceiver.

SUMMARY

The present disclosure provides an optical component having a good optical coupling efficiency.

The present disclosure provides an optical component optically coupled to an optical fiber. The optical component includes a substrate, an optical sensor and an edge-emitting laser. The substrate includes an accommodating cavity, a plurality of openings, a waveguide, an optical coupler and a plurality of pads. The waveguide and the optical coupler are distributed outside the accommodating cavity. The plurality of openings are distributed at a bottom surface of the accommodating cavity and the plurality of pads are located at bottoms of the plurality of openings. The optical coupler is optically coupled to an end of the waveguide and comprises a light-incident surface. The optical sensor is disposed on the substrate and is coupled to the waveguide to receive light from the optical fiber. The edge-emitting laser is embedded in the accommodating cavity and comprises a light-emitting layer and a plurality of bumps. The plurality of bumps are located in the plurality of openings and electrically connected to the plurality of pads. A ratio of a level height difference between the light-emitting layer and the optical coupler to a thickness of the optical coupler ranges from 0 to 0.5. And, a light emitted from the light-emitting layer enters the optical coupler through the light-incident surface and is transmitted to the optical fiber through the waveguide.

Accordingly, because the edge-emitting laser is embedded in the accommodating cavity of the substrate, a relative position of the edge-emitting laser and the optical coupler may be precisely controlled through the accommodating cavity (that is, passive alignment). The level height difference (that is, $\Delta H$) between the light-emitting layer of the edge-emitting laser and the optical coupler may be controlled within a tolerable range. And the optical coupling efficiency between the edge-emitter laser and the optical coupler is improved.

The foregoing will become better understood from a careful reading of a detailed description provided herein below with appropriate reference to the accompanying drawings.

DESCRIPTION OF THE EMBODIMENTS

Figure 1:
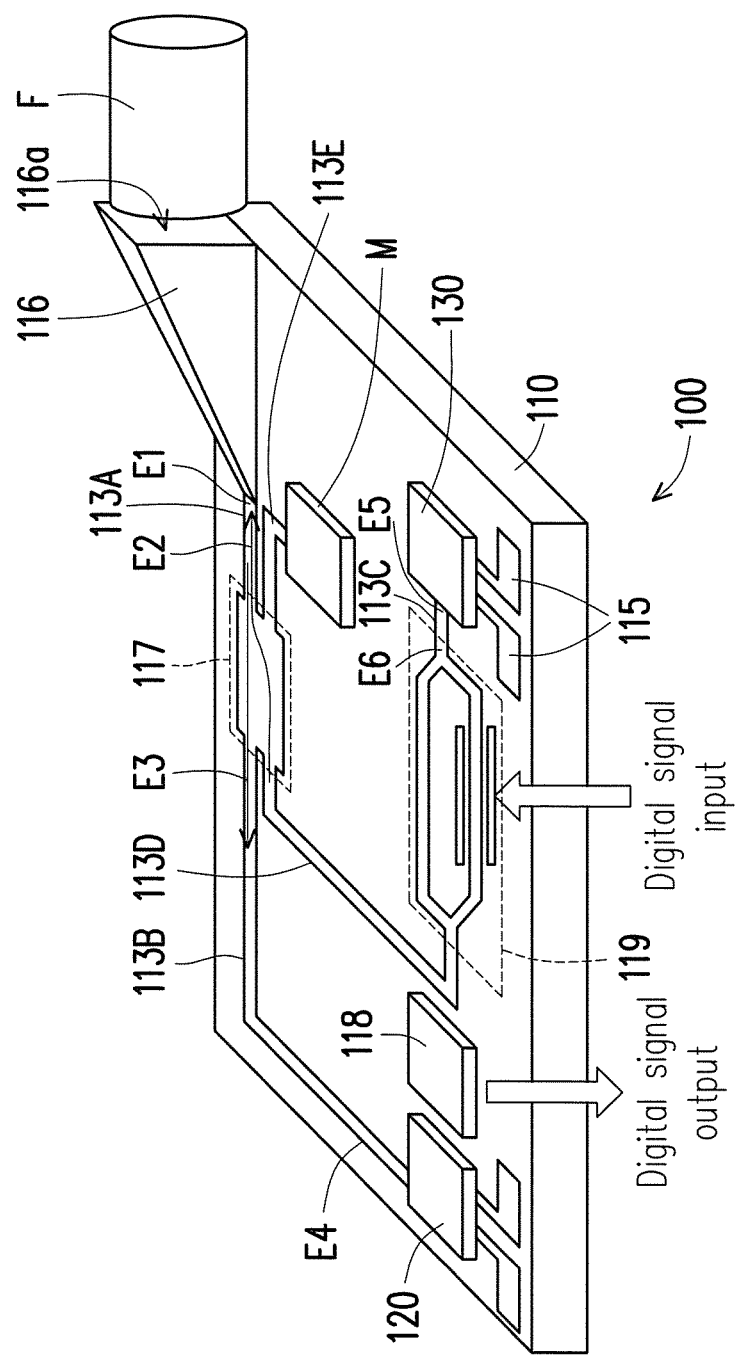
FIG. 1 is a schematic diagram illustrating an optical component according to an embodiment of this disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
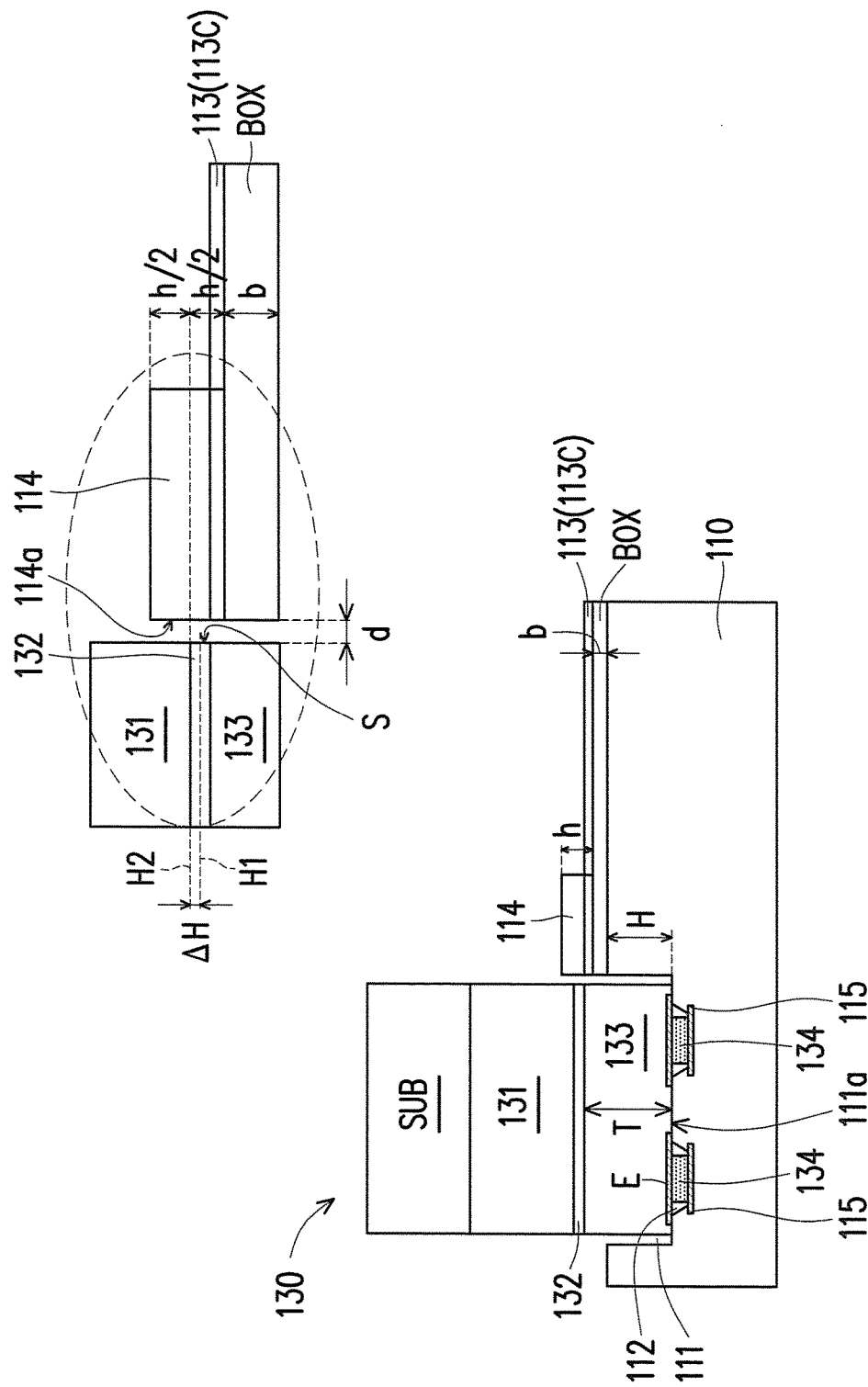
FIG. 2 is a schematic diagram illustrating a cross-sectional view of an optical coupler and an edge-emitting laser.

FIG. 1 is a schematic diagram illustrating an optical component according to an embodiment of this disclosure. FIG. 2 is a schematic diagram illustrating a cross-sectional view of an optical coupler and an edge-emitting laser. Referring to FIG. 1 and FIG. 2, in this embodiment, an optical component 100 is optically coupled to an optical fiber F, the optical component 100 comprises a substrate 110 and an edge-emitting laser 130 being partially embedded in the substrate 110 (as show in FIG. 2). The substrate 110 comprises an accommodating cavity 111, a plurality of openings 112, a waveguide 113, an optical coupler 114 and a plurality of pads 115. The waveguide 113 and the optical coupler 114 are distributed outside the accommodating cavity 111. The plurality of openings 112 are distributed at a bottom surface 111a of the accommodating cavity 111 and the plurality of pads 115 are located at bottoms of the plurality of openings 112. In other words, the plurality of pads 115 are exposed by the plurality of openings 112. The optical coupler 114 is optically coupled to an end of the waveguide 113 and comprises a light-incident surface 114a. The edge-emitting laser 130 is embedded in the accommodating cavity 111 of the substrate 110, the edge-emitting laser 130 comprises a light-emitting layer 132 and a plurality of bumps 134, the plurality of bumps 134 are located in the plurality of openings 112 and electrically connected to the plurality of pads 115. A level height difference ΔH between the light-emitting layer 132 of the edge-emitting laser 130 and the optical coupler 114 is less than or substantially equal to 1.5 micro-meters. And a light emitted from the light-emitting layer 132 enters the optical coupler 114 through the light-incident surface 114a of the optical coupler 114 and is transmitted to the optical fiber F through the waveguide 113.

Referring to FIG. 2, the waveguide 113 and the optical coupler 114 are, for example, formed on an oxide layer BOX of the substrate 110. A thickness of the oxide layer BOX is b, a thickness of the optical coupler 114 is h, the optical coupler 114 is adjacent to the edge-emitting laser 130 and the optical coupler 114 is optically coupled to the thinner end of a thickness of the waveguide 113. In order to ensure the optical coupling efficiency between the optical coupler 114 and the edge-emitting laser 130, for example, the coupling loss is suppressed to less than 3 dB or the optical coupling efficiency is higher than 60%, the thickness h of the optical coupler 114 should be greater than the thickness of the light-emitting layer 132. In one of exemplary embodiments of this disclosure, the thickness h of the optical coupler 114, for example, ranges from 1 micro-meter to 5 micro-meters. The thickness h of the waveguide 113, for example, ranges from 0.2 micro-meter to 0.5 micro-meter. A position of one-half the thickness of the light-emitting layer 132 is a first level height H1. A position of one-half the thickness of the optical coupler 114 is a second level height H2. The level height difference ΔH is the difference between the first level height H1 and the second level height H2. It should be noted that, the first level height H1 of the light-emitting layer 132 is, for example, above or below the second level height H2 of the optical coupler 114. The level height difference ΔH is positive, regardless the first level height H1 of the light-emitting layer 132 is, for example, above or below the second level height H2 of the optical coupler 114.

In one of exemplary embodiments of this disclosure, the optical component 100 is, for example, an optical transceiver capable of performing signal reception and transmission. The optical component 100 further comprises an optical sensor 120 when the optical component 100 is an optical transceiver. Wherein the optical sensor 120 is disposed on the substrate 110 and is coupled to the waveguide 113 to receive light from the optical fiber F. In other words, the optical sensor 120 in the optical component 100 is a selective component. It should be noted that, a matching architecture of the substrate 110 and the edge-emitting laser 130 in FIG. 1 and FIG. 2 may be applied to an optical transceiver or other optical components for receiving light.

In one of exemplary embodiments of this disclosure, the substrate 110 is, for example, a silicon on insulator (SOI) wafer. The accommodating cavity 111 and the plurality of openings 112 are, for example, fabricated in a silicon layer of the substrate 110. The waveguide 113 is, for example, fabricated on an insulator layer of the substrate 110. Generally, a refractive index of the waveguide 113 is greater than a refractive index of the optical coupler 114, and the refractive index of the optical coupler 114 is greater than a refractive index of the substrate 110 and outside (such as air). A matching design of the aforesaid refractive indexes may let a light emitted from the edge-emitting laser 130 being gradually coupled to the waveguide 113 through the optical coupler 114 which may help to transmit light. In one of exemplary embodiments of this disclosure, the refractive index of the waveguide 113 is n1, the refractive index of the optical coupler 114 is n2, and (n1−n2)/n1 ranges from 0.42 to 0.58. For example, the insulator layer is a silicon oxide layer (refractive index is about 1.45), a material of the waveguide 113 is silicon (refractive index is about 3.45), and a material of the optical coupler 114 is nitrogen silicon oxide (refractive index is about 1.56).

As shown in FIG. 1, in one of exemplary embodiments of this disclosure, the waveguide 113 may be distinguished by dividing the waveguide 113 into a plurality of portions (for example, a waveguide 113A, a waveguide 113B, a waveguide 113C, a waveguide 113D, and a waveguide 113E and so on). The present embodiment is not limited to the number and the type of the waveguide 113, those skilled person in the art can make appropriate changes according to the actual needs.

In one of exemplary embodiments of this disclosure, the optical component 100 is, for example, optically coupled to the optical fiber F through an optical coupler 116. The optical coupler 116 is also optically coupled to the waveguide 113A and comprises a light-incident surface 116a to receive light from the optical fiber F. The light from the optical fiber F has a specific wavelength. The waveguide 113A comprises an input end E1 and an output end E2. The input end E1 is coupled to the optical coupler 116. The output end E2 is coupled to a multiplexer/de-multiplexer 117. The light transmitted from the optical fiber F enters the optical coupler 116 through the light-incident surface 116a. The light entered the optical coupler 116 is transmitted to the waveguide 113A through the input end E1. The light transmitted to the waveguide 113A is output to the multiplexer/de-multiplexer 117 through the output end E2.

In one of exemplary embodiments of this disclosure, the light from the optical fiber F has a specific wavelength and specific coding through the multiplexer. After the light having the specific wavelength has been decoded by the de-multiplexer of the multiplexer/de-multiplexer 117, the decoded light is output to the waveguide 113B. As shown in FIG. 1, the waveguide 113B comprises an input end E3 and an output end E4. The input end E3 is coupled to the multiplexer/de-multiplexer 117 to receive the light which has been decoded by the multiplexer/de-multiplexer 117. The output end E4 is coupled to the optical sensor 120 to transmit the light into the optical sensor 120. In one of exemplary embodiments of this disclosure, the optical sensor 120 is, for example, a surface mounted device type photodiode (SMD-type photodiode) or a photosensitive component of other types. The optical sensor 120 receives light from the waveguide 113B and generates a photocurrent corresponding to the intensity of the light. The photocurrent generated by the optical sensor 120 is converted to a corresponding digital signal (for example, a voltage signal) through a trans-impedance amplifier (TIA) 118. The corresponding digital signal is further output to the other components (for example, network card or other back-end signal processing components) for performing a signal processing.

As shown in FIG. 1, the optical component 100 may decode and receive light from the optical fiber F through the optical coupler 116, the waveguide 113A, the multiplexer/de-multiplexer 117, the waveguide 113B, the optical sensor 120 and the trans-impedance amplifier 118. An optical signal carried by the light is converted to a digital signal and then is output.

As shown in FIG. 1, in one of exemplary embodiments of this disclosure, the optical component 100 comprises a modulator 119 to receive the digital signal. The modulator 119 performs modulating on the light emitted from the edge-emitting laser 130, according to the received digital signal. The light emitted from the edge-emitting laser 130 has a specific wavelength. In one of exemplary embodiments of this disclosure, the edge-emitting laser 130 is coupled to the modulator 119 through the waveguide 113C. The waveguide 113C comprises an input end E5 and an output end E6. The input end E5 is coupled to the edge-emitting laser 130. The output end E6 is coupled to the modulator 119.

The light modulated by the modulator 119 is transmitted to the multiplexer/de-multiplexer 117 through the waveguide 113D. The light transmitted to the waveguide 113D is transmitted to the fiber F via the waveguide 113A, the optical coupler 116 through the multiplexer of the multiplexer/de-multiplexer 117.

As shown in FIG. 1, the optical component 100 may convert the digital signal into an encoded optical signal through the edge-emitting laser 130, the waveguide 113C, the modulator 119, the waveguide 113D, the multiplexer/de-multiplexer 117, the waveguide 113A and optical coupler 116. And the encoded optical signal is transmitted to the optical fiber F.

In one of exemplary embodiments of this disclosure, the light modulated by the modulator 119 is transmitted to the multiplexer/de-multiplexer 117 through the waveguide 113D. The light may be partially sampled through an optical path design in the multiplexer/de-multiplexer 117, and then is transmitted to a monitoring component M through the waveguide 113E. The monitoring component M is used to monitor the output quality of the optical signal modulated by the modulator 119. When the optical signal sampled by the monitoring component M is abnormal, the monitoring component M may transmit a feedback signal to the modulator 119 or the optical component 100, to optimize a coding process performed on the light through the modulator 119.

The edge-emitting laser 130 is, for example, a Distributed Feedback (DFB) laser diode, however, the present embodiment is not limited thereto. In one of exemplary embodiments of this disclosure, the edge-emitting laser 130 is, for example, embedded in the accommodating cavity 111 through flip-chip bonding. Also, the edge-emitting laser 130 comprises a substrate SUB, a first type doped semiconductor layer 131, the light-emitting layer 132, a second type doped semiconductor layer 133 and two electrodes E. The first type doped semiconductor layer 131, the light-emitting layer 132 and the second type doped semiconductor layer 133 are stacked in sequence on the substrate SUB. The two electrodes E are electrically connected to the first type doped semiconductor layer 131 and the second type doped semiconductor layer 133, respectively. The plurality of bumps 134 are electrically connected between the two electrodes E and the plurality of pads 115. The edge-emitting laser 130 is a laser diode with a horizontal structure, that is, the two electrodes E of the edge-emitting laser 130 are distributed on the same side of the substrate SUB.

As shown in FIG. 2, the edge-emitting laser 130 is partially embedded in the accommodating cavity 111. A length and a width of the accommodating cavity 111 are slightly greater than a length and a width of the edge-emitting laser 130, respectively. A depth of the accommodating cavity 111 is less than an overall thickness of the edge-emitting laser 130. The accommodating cavity 111 may be used to substantially restrict a setting orientation of the edge-emitting laser 130. Specifically, the second type doped semiconductor layer 133 of the edge-emitting laser 130 is located in the accommodating cavity 111, the plurality of bumps 134 of the edge-emitting laser 130 are located in the plurality of openings 112 under the accommodating cavity 111, while the substrate SUB, the first type doped semiconductor layer 131 and the light-emitting layer 132 of the edge-emitting laser 130 are located above the accommodating cavity 111. In one of exemplary embodiments of this disclosure, a thickness T of the second type doped semiconductor layer 133 may be, for example, slightly greater than the depth H of the accommodating cavity 111.

It should be noted that, because the accommodating cavity 111 may be fabricated in the substrate 110 by a lithography etching process, the depth H and the size of the accommodating cavity 111 may be controlled precisely. In addition, because the edge-emitting laser 130 is located at the bottom surface 111a of the accommodating cavity 111 through flip-chip bonding, the edge-emitting laser 130 embedded in the accommodating cavity 111 may be also controlled precisely, and it is not affected by a height variation of the plurality of bumps 134 (in a reflow process). In one of exemplary embodiments of this disclosure, the bottom surface 111a of the accommodating cavity 111 may be of any material, for example, the bottom surface 111a of the accommodating cavity 111 may be a semiconductor layer, a bearing surface provided by a dielectric layer, however, the disclosure is not limited thereto. Accordingly, with a design of matching the accommodating cavity 111 and the plurality of openings 112 of the substrate 110, an embedding degree of the edge-emitting laser 130 may be controlled precisely. The foregoing alignment mechanism is a passive alignment, therefore it is helpful to improve the efficiency of assembly and yield of the substrate 110 and the edge-emitting laser 130. Under the precondition that the relative position of the edge-emitting laser 130 and the optical component 100 may be controlled stably, the level height difference ΔH between the light-emitting layer 132 of the edge-emitting laser 130 and the optical coupler 114 may be controlled within a tolerable range (less than or equal to 1.5 micro-meters), thereby improving the optical coupling efficiency between the edge-emitting laser 130 and the optical coupler 114. As shown in FIG. 2, when the level height difference ΔH between the light-emitting layer 132 of the edge-emitting laser 130 and the optical coupler 114 approximates to zero, the first level height H1 of the light-emitting layer 132 and the second level height H2 of the optical coupler 114 substantially align.

In one of exemplary embodiments of this disclosure, a gap d between the edge-emitting laser 130 and the optical coupler 114 will affect the optical coupling efficiency between the edge-emitting laser 130 and the optical coupler 114. Specifically, the light-emitting layer 132 of the edge-emitting laser 130 comprises a side surface S adjacent to the optical coupler 114, and the gap d between the side surface S of the light-emitting layer 132 and the light-incident surface 114a of the optical coupler 114 is reserved, and the gap d ranges, for example, from 1 micro-meter to 5 micro-meters. In addition, the side surface S of the light-emitting layer 132 and the light-incident surface 114a are substantially parallel.

Figure 3:
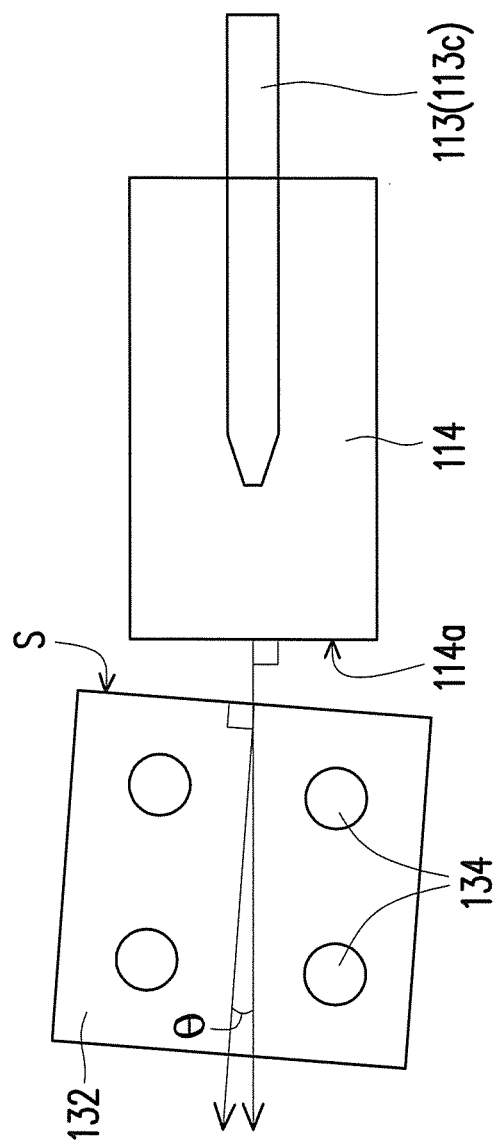
FIG. 3 is a schematic diagram illustrating a top view of an optical coupler and a light-emitting layer.

FIG. 3 is a schematic diagram illustrating a top view of an optical coupler and a light-emitting layer. Referring to FIG. 3, in order to avoid the light emitted from the light-emitting layer 132 is reflected back to the light-emitting layer 132 and results in reducing optical coupling efficiency, the present embodiment may change the setting orientation of the light-emitting layer 132 of the edge-emitting laser 130 to form an angle θ between a normal vector of the side surface S of the light-emitting layer 132 and a normal vector of the light-incident surface 114a. The angle θ ranges, for example, from 5 degrees to 15 degrees.

Figure 4A:
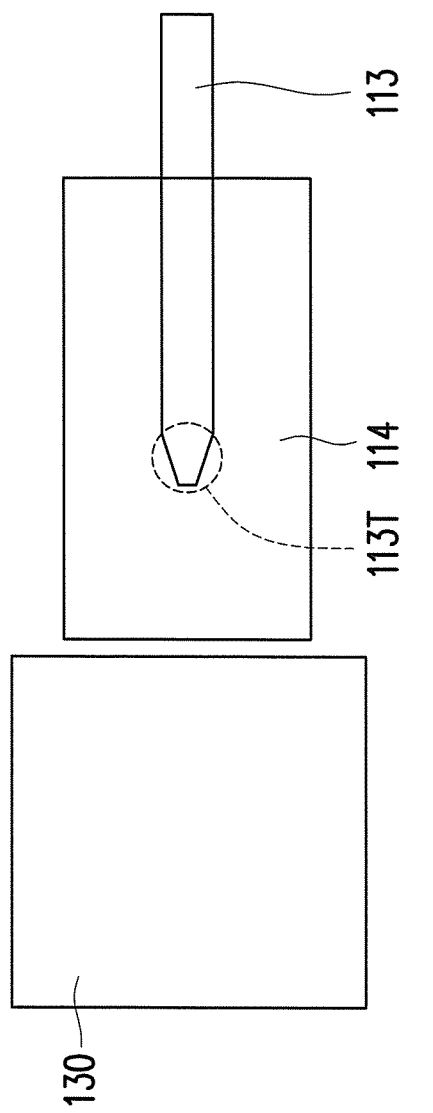
FIG. 4A and FIG. 4B are schematic diagrams illustrating a top view of an optical coupler, a waveguide and an edge-emitting laser.
Figure 4B:
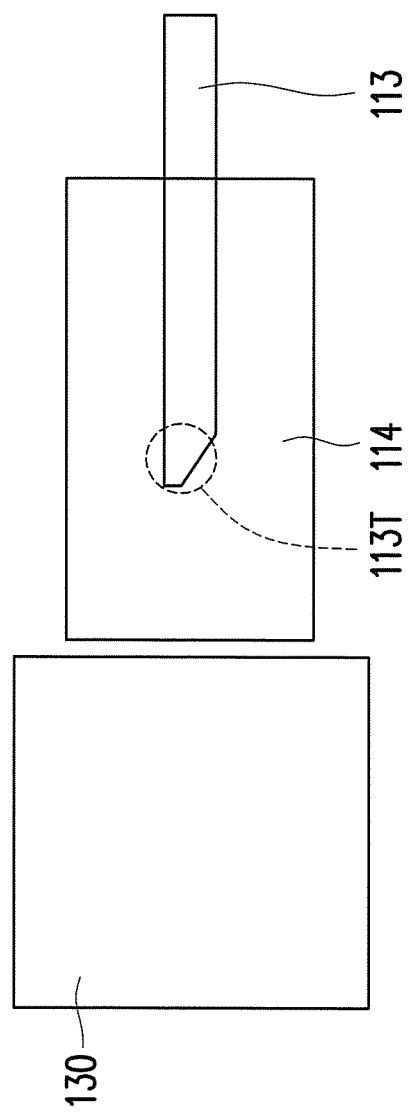

FIG. 4A and FIG. 4B are schematic diagrams illustrating a top view of an optical coupler, a waveguide and an edge-emitting laser. Referring to FIG. 4A and FIG. 4B, the waveguide 113 has one end, which is covered by the optical coupler 114 and with a design of tapered width (that is, a tapered portion 113T). In other words, the end of the waveguide 113 adjacent to the edge-emitting laser 130 comprises a tip, and the tip points toward the edge-emitting laser 130. As shown in FIG. 4A, the tip comprises a symmetrical contour in an extended direction (that is, a longitudinal direction) along the waveguide 113. As shown in FIG. 4B, the tip comprises an asymmetrical contour in an extended direction (that is, a longitudinal direction) along the waveguide 113. In one of exemplary embodiments of this disclosure, a length of the tapered portion 113T is, for example, greater than 100 micro-meters. A maximum width of the waveguide 113 (that is, the region outside the tapered portion 113T) ranges, for example, from 300 nano-meters to 600 nano-meters. A width of the optical coupler 114 ranges, for example, from 1 micro-meter to 5 micro-meters. And a length of the optical coupler 114 is long enough to cover the tapered portion 113T.

Because the relative position of the edge-emitting laser 130 and the optical coupler 114 may be controlled precisely by the accommodating cavity 111, that is, passive alignment. Therefore the level height difference ΔH between the light-emitting layer 132 of the edge-emitting laser 130 and the optical coupler 114 may be controlled within a tolerable range, and the optical coupling efficiency between the edge-emitting laser 130 and the optical coupler 114 is improved.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An optical component optically coupled to an optical fiber, the optical component comprising:
   a substrate, comprising an accommodating cavity, a plurality of openings, a waveguide, an optical coupler and a plurality of pads, wherein the waveguide and the optical coupler are distributed outside the accommodating cavity, the plurality of openings are distributed at a bottom surface of the accommodating cavity, the plurality of pads are located at bottoms of the plurality of openings, and the optical coupler is optically coupled to an end of the waveguide and comprises a light-incident surface; and
   an edge-emitting laser, embedded in the accommodating cavity and comprising a light-emitting layer and a plurality of bumps located in the plurality of openings and electrically connected to the plurality of pads, wherein a ratio of a level height difference between the light-emitting layer and the optical coupler to a thickness of the optical coupler ranges from 0 to 0.5, and a light emitted from the light-emitting layer enters the optical coupler through the light-incident surface and is transmitted to the optical fiber through the waveguide.

2. The optical component according to claim 1, wherein a refractive index of the waveguide is n1, a refractive index of the optical coupler is n2, and (n1−n2)/n1 ranges from 0.42 to 0.58.

3. The optical component according to claim 1, wherein the edge-emitting laser comprises a Distributed Feedback laser diode.

4. The optical component according to claim 1, wherein the edge-emitting laser is embedded in the accommodating cavity through a flip-chip bonding, and the edge-emitting laser further comprises:
   a substrate;
   a first type doped semiconductor layer;
   a second type doped semiconductor layer, wherein the first type doped semiconductor layer, the light-emitting layer and the second type doped semiconductor layer are stacked in sequence on the substrate; and
   two electrodes, electrically connected to the first type doped semiconductor layer and the second type doped semiconductor layer, respectively, wherein the plurality of bumps are electrically connected between the electrodes and the plurality of pads.

5. The optical component according to claim 4, wherein the second type doped semiconductor layer is located in the accommodating cavity, and the substrate and the first type doped semiconductor layer are located above the accommodating cavity.

6. The optical component according to claim 1, wherein the edge-emitting laser is partially embedded in the accommodating cavity.

7. The optical component according to claim 1, wherein the edge-emitting laser is located at the bottom surface of the accommodating cavity, and a gap between the edge-emitting laser and the light-incident surface of the optical coupler is reserved.

8. The optical component according to claim 7, wherein the gap ranges from 1 micro-meter to 5 micro-meters.

9. The optical component according to claim 7, wherein the light-emitting layer comprises a side surface adjacent to the optical coupler, and the side surface and the light-incident surface are substantially parallel.

10. The optical component according to claim 7, wherein the light-emitting layer comprises a side surface adjacent to the optical coupler, and an angle between a normal vector of the side surface and a normal vector of the light-incident surface ranges from 5 degrees to 15 degrees.

11. The optical component according to claim 1, wherein a first level height of the light-emitting layer and a second level height of the optical coupler substantially align.

12. The optical component according to claim 1, wherein the waveguide comprises a tapered portion with tapered width, and the tapered portion is adjacent to the edge-emitting laser and covered by the optical coupler.

13. The optical component according to claim 1, wherein the level height difference between the light-emitting layer and the optical coupler is less than or substantially equal to 1.5 micro-meters.

* * * * *